United States Patent [19]

Crossley et al.

[11] Patent Number: 4,637,068
[45] Date of Patent: Jan. 13, 1987

[54] RING HYBRID MIXING

[75] Inventors: Ian Crossley, Andover; Daniel Donoghue, Tewksbury; Steven Mittleman, Framingham; Seth Nash, Boston, all of Mass.

[73] Assignee: Alpha Industries, Inc., Woburn, Mass.

[21] Appl. No.: 699,918

[22] Filed: Feb. 8, 1985

[51] Int. Cl.[4] .................................. H04B 1/26
[52] U.S. Cl. .................................. 455/327; 455/330
[58] Field of Search .............. 455/327, 326, 325, 330; 330/4.9

[56] References Cited

U.S. PATENT DOCUMENTS 3,534,267 10/1970 Hyltin ................................ 455/327
3,619,787 11/1971 Salzberg .......................... 455/327
4,008,438 2/1977 Shinkawa et al. ................ 455/327

Primary Examiner—Robert L. Griffin
Assistant Examiner—Andrew J. Telesz, Jr.
Attorney, Agent, or Firm—Charles Hieken

[57] ABSTRACT

A hybrid ring mixer includes an annular conducting ring on a gallium arsenide substrate coated on the bottom with a conducting layer to comprise a strip transmission line. Three conductors spaced by 120° extend radially outward from the annular ring to define local oscillator, signal input and i-f ports, respectively. A pair of conductors spaced by substantially 120° extend radially inward to comprise diode ports. A conducting surface inside the annular ring is grounded and has circular sectors of different radius bounded by radii extending from the center of the ring and bisecting the signal and local oscillator ports, respectively. The sector of larger radius is located in the 120° sector between the signal and local oscillator ports. Mesa diodes are connected between each of the diode ports and the sector of smaller radius. A via opening surrounded by a conducting layer extends between the bottom and top of the substrate to establish conducting contact between the bottom conducting layer and the grounded conducting surface. The circuit is formed by diffusing n+ and n epitaxial layers into the substrate, etching through the end layer and depositing a cathode ohmic contact on the n+ layer, establishing an anode contact on the n layer, metalizing the substrate upper surface to form the circuit, etching through the bottom of the substrate to form the via opening and plating the back side of the substrate and the region around the via opening.

5 Claims, 28 Drawing Figures

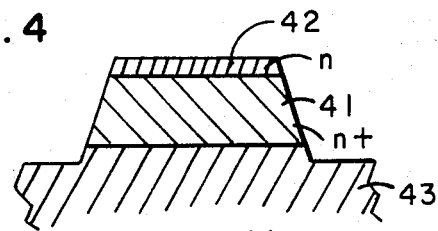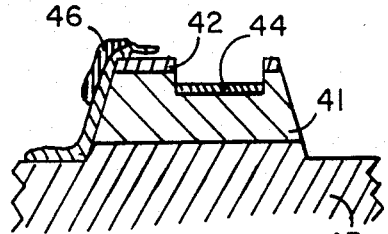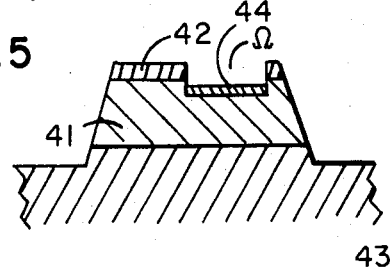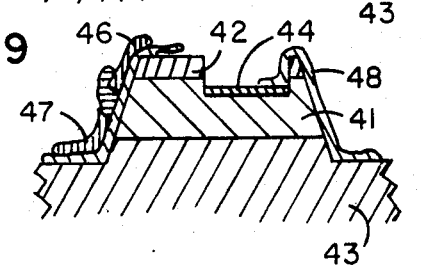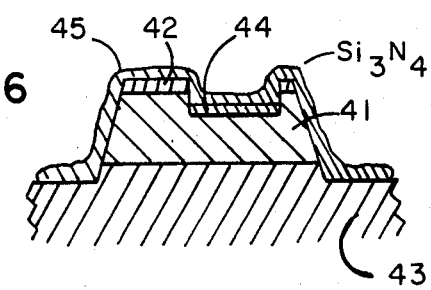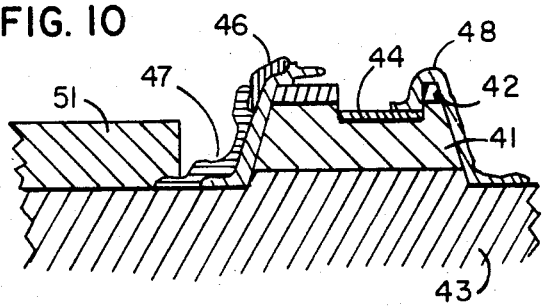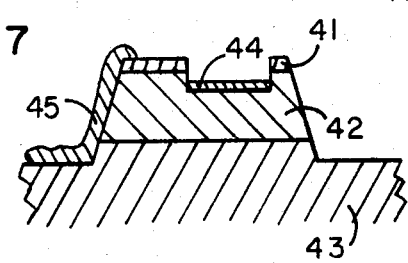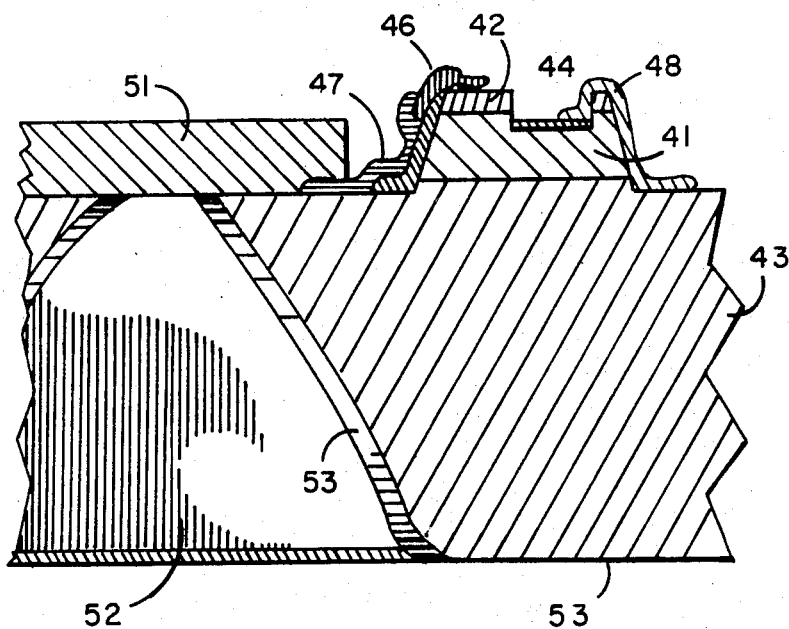

RING HYBRID MIXING

The present invention relates in general to ring hybrid mixing and more particularly concerns novel apparatus and techniques for providing an exceptionally compact monolithic ring hybrid microwave mixer characterized by good electrical performance. The invention may be readily and accurately reproduced in large quantities relatively reliably and inexpensively.

A ring hybrid is known in the art and typically comprises a continuous transmission line path in the form of a ring having ports spaced along the ring by one or more quarter wavelengths. When used in a mixer, there may be local oscillator and signal ports for receiving local oscillator and input signals, respectively, at microwave frequencies, first and second diode ports each having a mixer diode, and an i-f port for extracting the i-f signal of frequency corresponding to the difference between the local oscillator and input signal frequencies. Typically, the local oscillator port is at the ring midway between the diode ports a quarter wavelength away from each and a half wavelength away from both the signal input port and the i-f port. In the typical prior art approach, the microwave diodes are positioned outside the ring. This arrangement wastes space and results in the diodes having greater potential for radiating potentially interfering signals to nearby circuits when a part of a receiver or other system having densely packed components.

It is an important object of the invention to provide an improved microwave ring hybrid mixer and method of making it.

According to the invention, there is a ring hybrid, preferably a monolithic circuit comprising a conducting ring, preferably circular, having a plurality of conductors extending radially outward to comprise respective signal ports, and at least one conductor extending radially inward to define a mixer diode port, a central conductor inside said conducting ring, and at least one microwave diode connected between said central conductor and said radially inward conductor. Preferably, there are two conductors extending radially inward with a respective microwave diode connected between a respective conductor extending radially inward and the central conductor. Typically there are three conductors extending radially outward spaced 120° about the ring, two conductors extending radially inward angularly spaced by 120° with the angle between bisected substantially by one of the conductors extending radially outward that typically comprises the local oscillator port. One of the other conductors extending radially outward comprises the input signal port, and the third conductor extending radially outward comprises the i-f port. Preferably, the central conductor comprises first and second circular sectors originating from the center of the ring. The first sector is of smaller radius that creates an insulating gap between the smaller circular sector and the ring portion between both diode branches and between each diode branch and the i-f and input signal branches of annular width greater than the radius of the smaller circular sector. The larger circular sector defines with the ring in the remaining portion thereof an annular insulating gap of radial width less than the radius of the larger circular sector and of the order of the radius of the smaller circular sector. The diodes and conductors are preferably formed in situ in a monolithic circuit comprising a semi-insulating substrate, typically GaAs semi-insulating material, separating signal conductors from a ground conductor. A via opening in the substrate is surrounded by conducting material interconnecting the ground conductor and central conductor.

Numerous other features, objects and advantages of the invention will become apparent from the following specification when read on connection with the drawing in which:

FIGS. 4–11 are fragmentary diagrammatic views of portions of a wafer helpful in understanding the steps in connection with making a monolithic mixer according to the invention;

Figure 1:
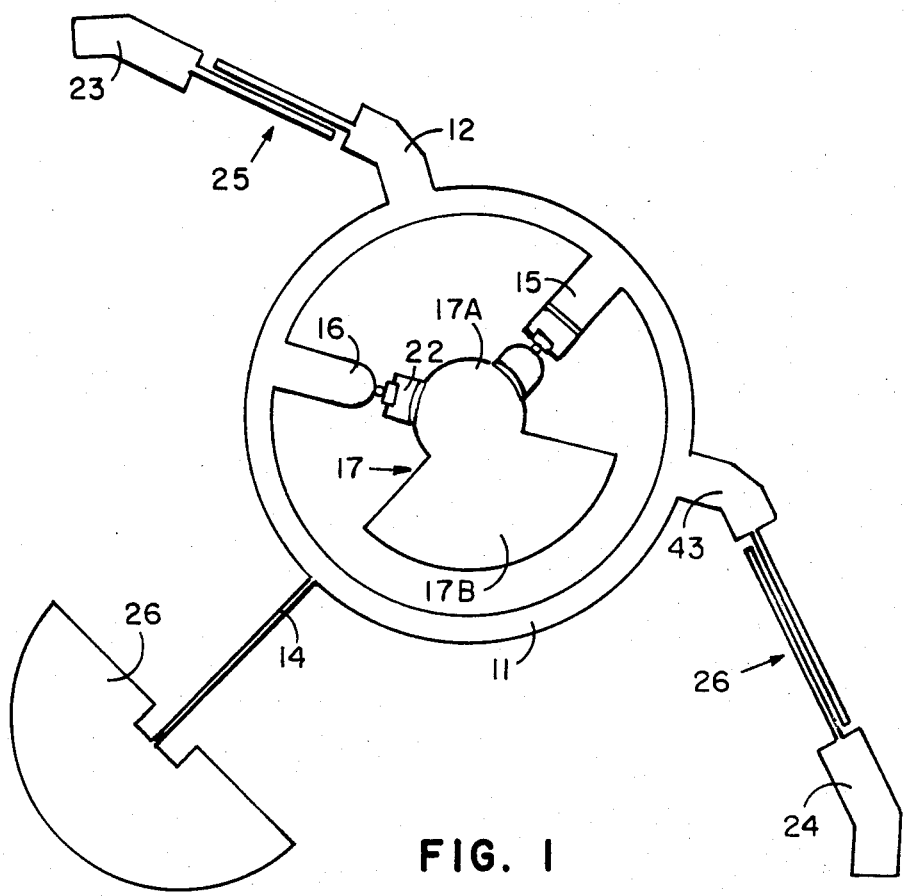
FIG. 1 is a plan enlarged view of a ring hybrid mixer according to the invention.

With reference now to the drawing and more particularly FIG. 1 thereof, there is shown a plan view of an embodiment of the invention comprising conductors on a semi-insulating substrate having the bottom or backside surface coated with conducting material to coact with the ungrounded conductors to form planar transmission lines.

The invention comprises a circular annular ring 11. A conductor 12 extends radially outward to comprise a local oscillator port. A second conductor 13 extends radially outward to comprise an input signal port. A third conductor 14 extends radially outward to comprise an i-f port. Conductors 15 and 16 extend radialy inward to comprise first and second diode ports, respectively.

Conductor 17 is grounded through a via opening to the conducting surface on the backside. Conductor 17 comprises a smaller circular sector 17A and a larger circular sector 17B, each concentric about the center 18 of ring 12. Sectors 17A and 17B are bounded by radii bisecting conductors 13 and 14. The radius of section 17A is such that the insulating region between section 17A and ring 11 has a radial dimension greater than the radius of sector 17A. The insulating region between section 17B and ring 11 has a radial dimension that is less than the radius of section 17B and of the order of the radius of section 17A.

Diodes 21 and 22 are oppositely poled and connected between conductors 15 and 16, respectively, Local oscillator input terminal 23 and signal input terminal 24 are coupled to conductors 12 and 13, respectively, by nonconductive couplings 25 and 26, respectively. I-f terminal 27 is connected to conductor 14.

Having described the physical arrangement of the mixer according to the invention, its mode of operation will be briefly described. As in a conventional ring hybrid mixer, a local oscillator signal applied to local oscillator terminal 23 is mixed with a signal input applied to signal input terminal 24 in the circuitry comprising diodes 21 and 22 to produce a signal of difference frequency that is received on i-f terminal 26. The hybrid circuit effectively isolates the local oscillator and input signal ports from each other. Sector 17B helps compensate for conductors 15 and 16 to maintain the characteristic impedance of the transmission line comprising ring 11 substantially constant.

An advantage of this structural arrangement is that the space inside the ring, wasted in prior art devices, is utilized for the microwave diodes, thereby increasing the number of circuits which may be fabricated upon a wafer of given area. This arrangement also results in the diodes being positioned further away from adjacent circuitry that might be adversely affected by spurious signal components developed by the microwave diodes in the mixing process. These results are obtained without sacrificing electrical performance with the aid of section 17B. The invention typically operates within the frequency range of 30 GHz–40 GHz.

Figure 2:
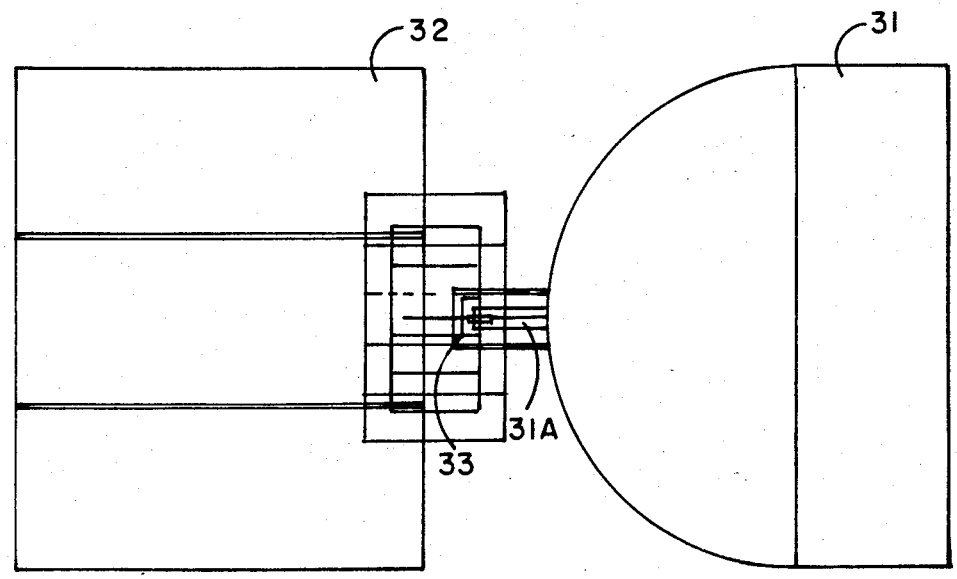
FIG. 2 is a still further enlarged view of a planar mixer diode preferably used in the invention.

Referring to FIG. 2, there is shown a greatly enlarged plan view of microwave planar mixer diodes 21 and 22. The diode is connected between electrodes 31 and 32 that are connected to a conductor inside ring 11, such as conductors 15, 16 or 17. Conductor 31 is formed with a beam lead 31A that contacts the top of a mesa gallium arsenide device having its bottom conducting layer connected to electrode 32.

Figure 3:
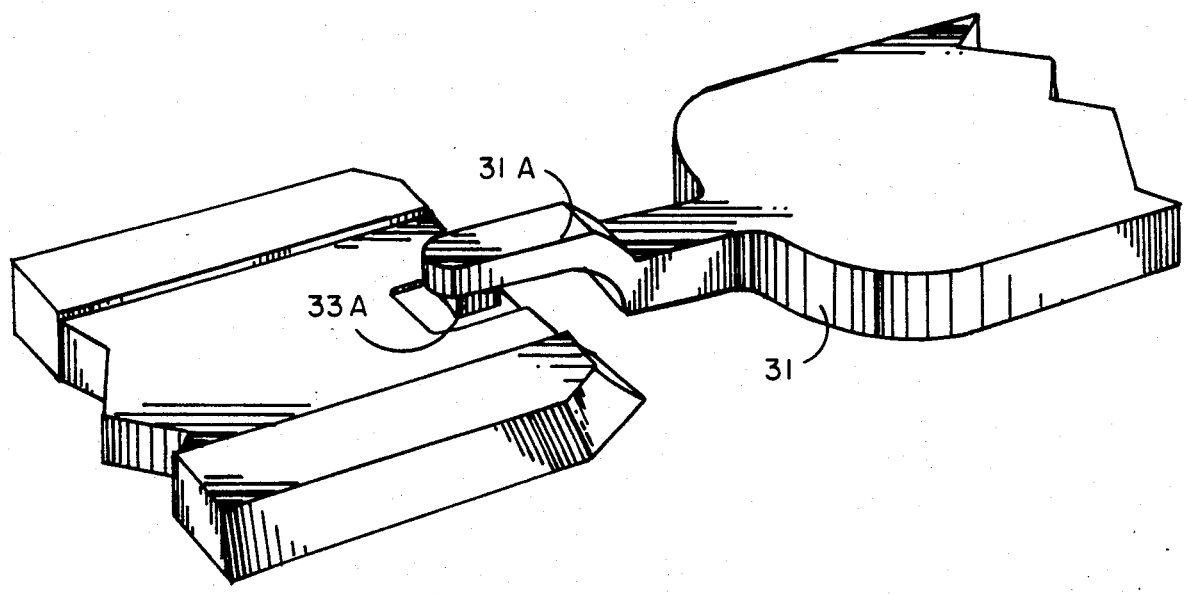
FIG. 3 is an enlarged perspective view of the planar mixer diode assembly used in the invention.

Referring to FIG. 3, there is shown a perspective view showing beam lead 31A contacting mesa 33A.

A feature of the invention resides in fabricating mesa diodes 21 and 22 in the substrate and then metalizing the top surface to form the ring hybrid mixer signal conductors of FIG. 1, etching a via opening through the bottom surface below the central conductor 17 and metalizing the bottom surface and the wafer surrounding the via to establish a ground conductor and connection of the ground conductor to the central conductor.

Referring to FIGS. 4–11, there are shown diagrammatic fragmentary views of portions of the substrate helpful in understanding the steps in the process. The n+ and n epitaxial layers, such as 41 and 42, are grown upon a semi-insulating GaAs substrate, such as 43. The n+ epitaxial layer 41 is 1–4 microns thick and has a carrier level greater than $1 \times 10^{18}/cm^3$. The n layer typically has a carrier concentration between $5 \times 10^{16}/cm^3$ and $3 \times 10^{17}/cm^3$, although a greater range would also work. The thickness of the n layer, obtained by growing to thickness or by etching back a thicker layer, is preferably 500–1500 angstroms. Thicker layers also work, but result in series resistances usually undesirable.

The next step is to electrically isolate a small area of epi layers for the diodes by etching the epi layers down to the semi-insulating substrate 43 to provide mesa isolation as shown in FIG. 4.

The next step involves etching through n layer 42 into n+ and layer 41 in a selected region which is to form the cathode and ohmic contact as shown in FIG. 5. A sequence of AuGe:Ni evaporation is preferably used to deposit the ohmic metal 44. The photoresist that was used to pattern the cathode region is also used in a lift-off process to confine the ohmic metal to the recessed area. The ohmic metal 44 is then sintered to form the ohmic contact.

The next step is to deposit an $Si_3N_4$ layer over the mesa for the purpose of coating the mesa edge for subsequent metal isolation and anode formation as shown in FIG. 6.

In the next step the structure is coated with photoresist, and the photoresist is patterned for the anode. The photoresist acts as a mask for etching the nitride and as a lift-off agent for the anode metalization. The $Si_3N_4$ layer is removed (etched) in the indicated area as shown in FIG. 7 to expose the n layer 42 and ohmic contact 44.

In the next step, the top anode metal 46 is deposited to establish contact with layer 42 as shown in FIG. 8. The next step is to deposit the anode contact bus metal and cathode contact bus metal 48 as shown in FIG. 9, followed by depositing and defining circuit metal, such as 51 as shown in FIG. 10.

The wafer is completed by thinning the wafer to the desired thickness, etching via holes, such as 52, to the metal on the diode side, such as 51, and depositing the back side metal 53 in the via and on the back of the wafer as shown in FIG. 11.

Figure 12:
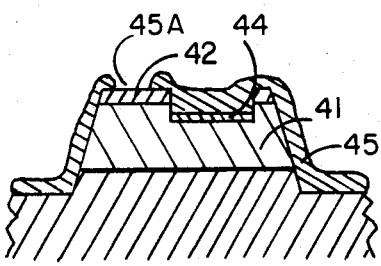
FIGS. 12 and 13 are similar views illustrating some steps in an alternate dielectric process for making the monolithic mixer circuit according to the invention.
Figure 13:
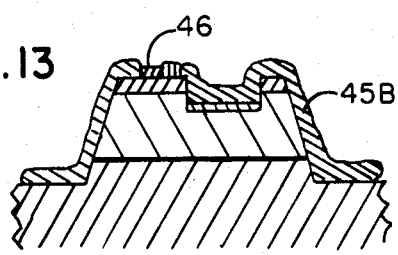
Figure 14:
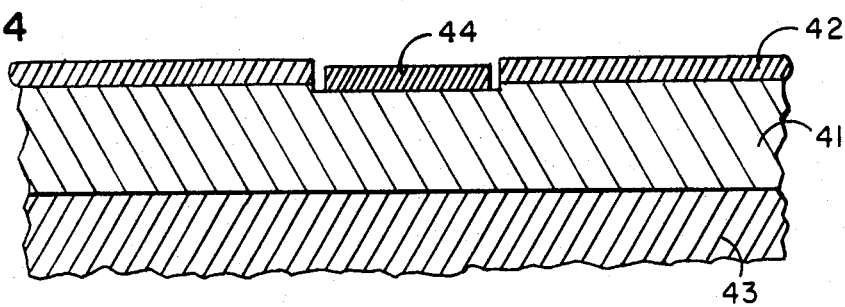
FIGS. 14–20 are similar views of an alternate air bridge process according to the invention.

Referring to FIGS. 12 and 13, there are shown fragmentary diagrammatic representations of a portion of the structure to illustrate alternate steps in the process for making a monolithic mixer circuit according to the invention. The steps prior to etching $Si_3N_4$ are the same as described above and illustrated in FIGS. 4–6. However, layer 45 is etched only through opening 45A to form an anode opening exposing the top surface of layer 42 as shown in FIG. 12. The structure is coated with photoresist, and the photoresist is patterned for anode opening 45A. The photoresist acts as a mask for etching the nitride and as a lift off agent for the anode metalization. The $Si_3N_4$ is removed (etched) in opening 45A. The anode metal is then deposited and patterned in a lift off process with this resist as shown in FIG. 13. The remaining nitride 45B is patterned to allow contact to the cathode and the substrate. The remaining steps are as described above in connection with FIGS. 9–11.

Figure 15:
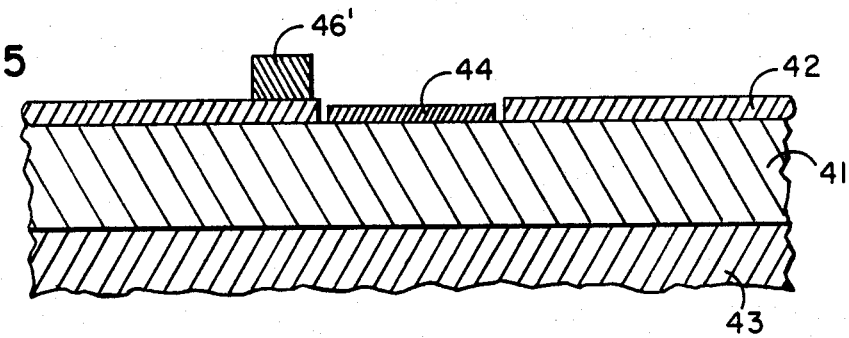
Figure 16:
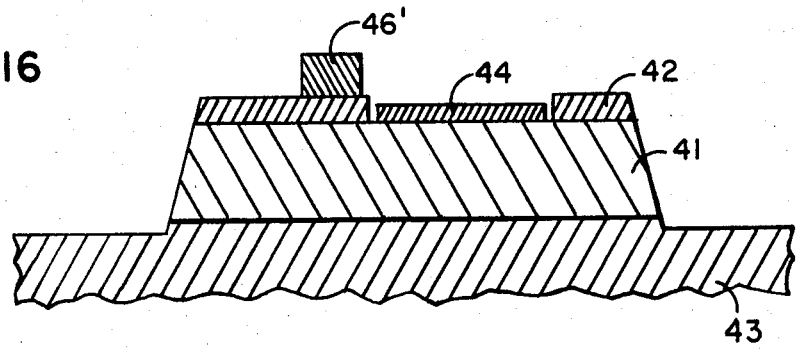

Referring to FIGS. 14–20, there is shown fragmentary diagrammatic representations of a portion of the structure helpful in understanding the steps in an alternate air bridge process for making mixer circuits according to the invention. This process improves device performance by lowering the parasitic capacitance of the anode metal over the dielectric while simplifying the overall process. First, a step similar to that described above in connection with FIG. 10 involves etching through end layer 42 and depositing contact metal 44 on n+ layer 41. The anode is then defined by a lift-off process using a multi-layered photoresist sequence. The multi-layered resist is necessary to lift-off the anode 46', which is greater than 2 microns high as shown in FIG. 15. The next step is the mesa isolation as shown in FIG. 16. Note that the nitride deposition steps have been eliminated in this process.

Figure 17:
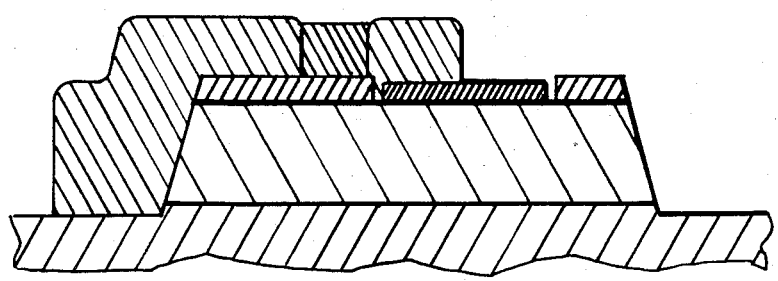
Figure 18:
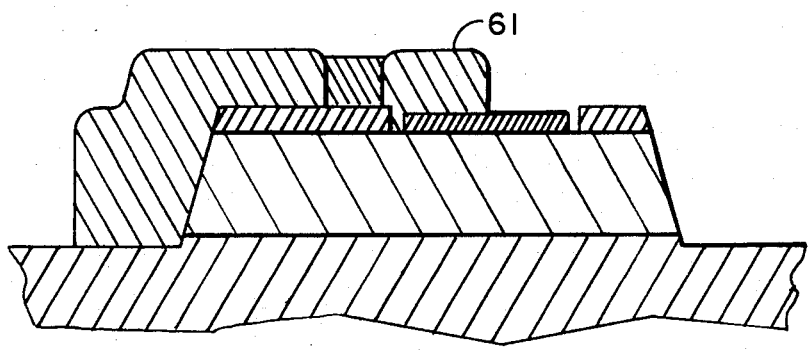
Figure 19:
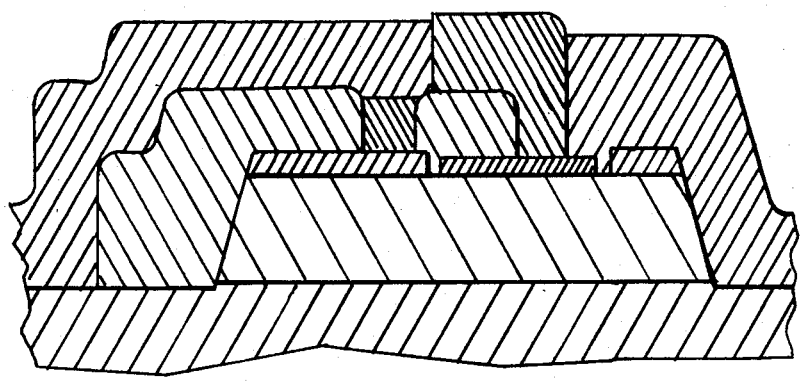
Figure 20:
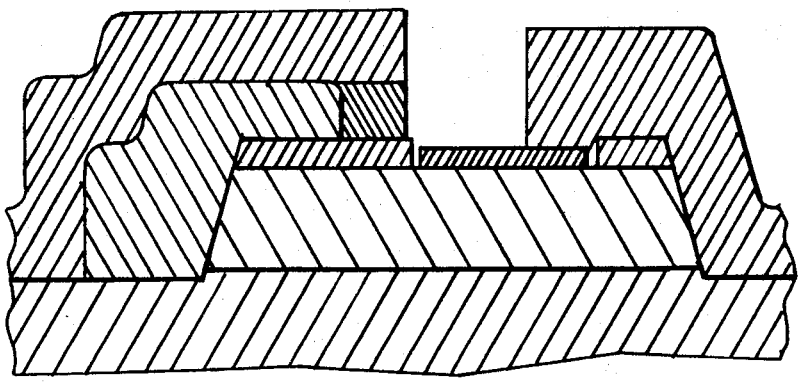

The next step involves resist definition 47' for forming the air bridge to anode 46'. This contact is made by an air bridge to avoid contacting anode 46' to the n+ epilayer 41. Contact to the cathode and circuit definition are accomplished with the same metalization steps as the air bridge. FIG. 17 shows the resist definition 47' necessary to form the bridge. The resist is plasma etched slightly to insure the anode metal is clean of resist and exposed. The next step is the deposition of a metal contact layer 61 needed to place the metal which will form the circuit and contacts to the circuit as shown in FIG. 18. The contact layer is patterned for selective plating, and the air bridge 47", contacts 48' and circuit conductors are plated simultaneously as shown in FIG. 19. The diode is completed by stripping the resist 47', etching the thin contact layer 61 and removing the resist 47' from under the bridge 47" as shown in FIG. 20. The remainder of the process is the same as described above in connection with the description of FIG. 11.

Figure 21:
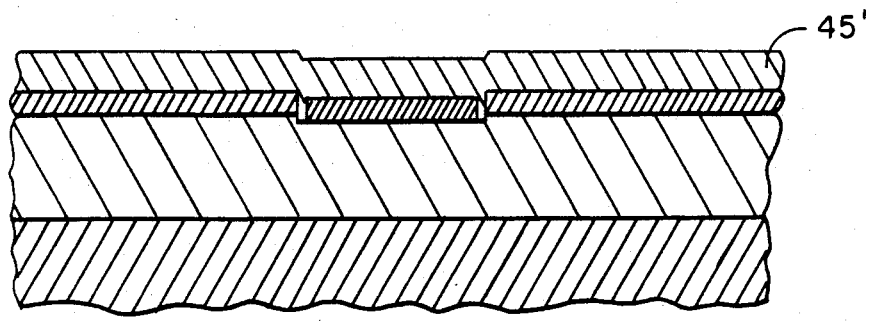
Figure 22:
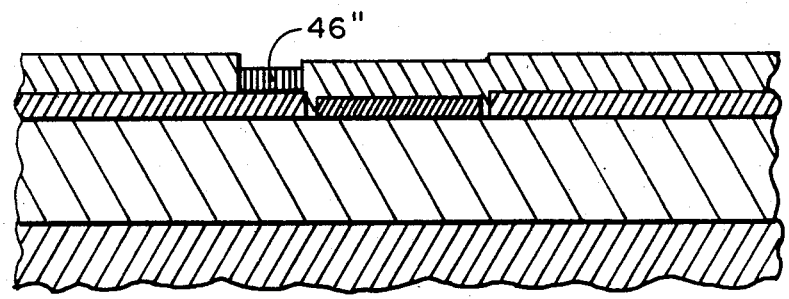
Figure 23:
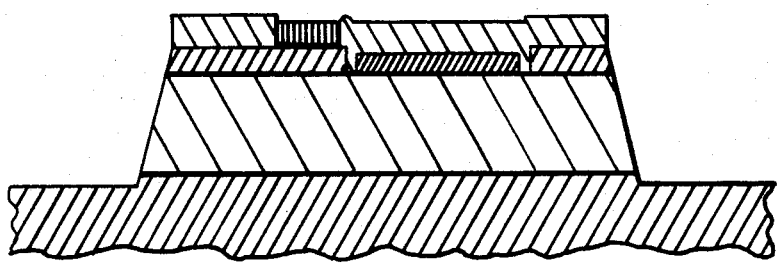
Figure 24:
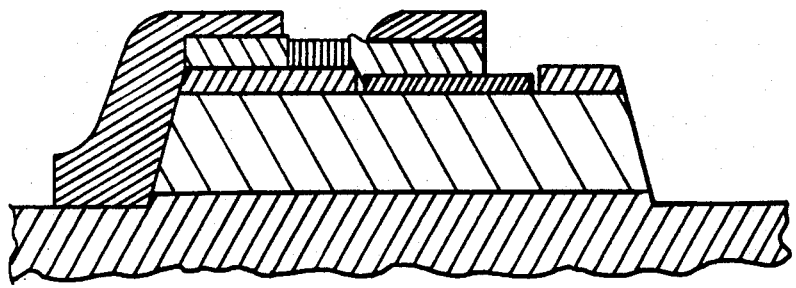
FIGS. 24–28 are similar views of steps in still another alternate air bridge process according to the invention.
Figure 25:
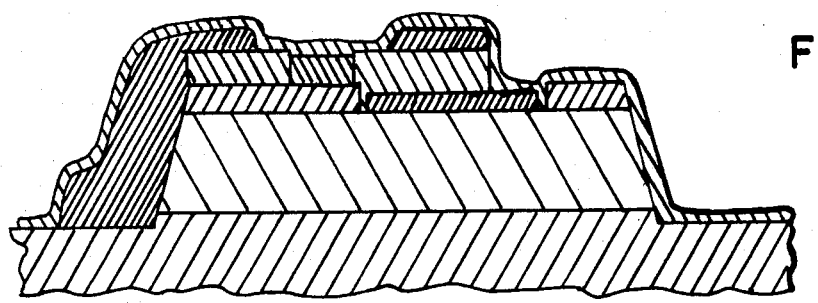
Figure 26:
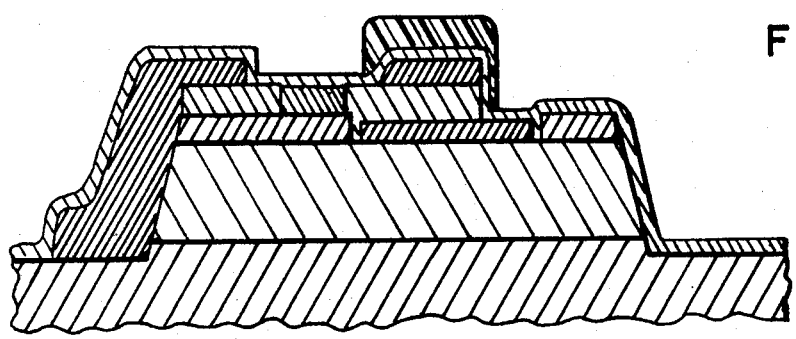
Figure 27:
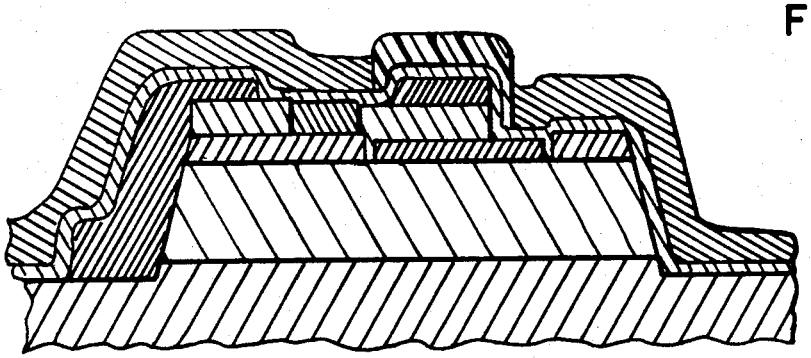
Figure 28:
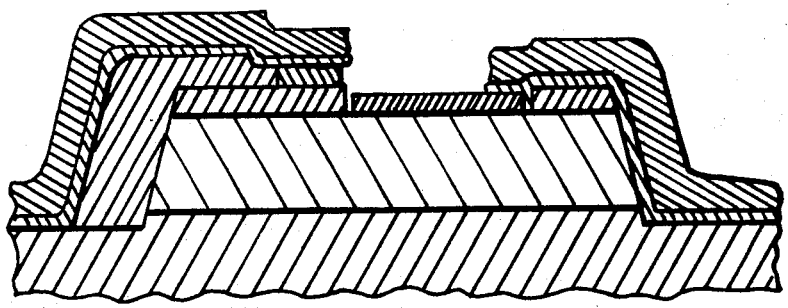

Referring to FIGS. 21-27, there is shown a fragmentary diagrammatic representation of portions of the structure helpful in understanding an alternate air bridge process for making monolithic mixer circuits according to the invention. This process facilitates processing with increased reliability and yield as compared with the air bridge process just described. The first step is the same as that described above in connection with FIG. 14. Step 2 involves deposition of a nitride layer 45' as shown in FIG. 21. The nitride layer 45' is then patterned for the anode feature, and the anode 46" deposited and formed with a lift-off process using the same resist and is almost planar with nitride layer 45' as shown in FIG. 22. The next step involves mesa isolation as shown in FIG. 23. The remaining steps shown in FIGS. 24-27 are the same as described above in connection with FIGS. 17-20; except that in the step illustrated in FIG. 28, the nitride layer 45' is also removed.

There has been described novel apparatus and techniques for providing a compact reproducible hybrid ring mixer. It is evident that those skilled in the art may now make numerous uses and modification of and departures from the specific apparatus and techniques herein disclosed without departing from the inventive concepts. Consequently, the invention is to be construed as embracing each and every novel feature and novel combination of features presented in or possessed by the apparatus and techniques herein disclosed and limited solely by the spirit and scope of the appended claims.

What is claimed is:

1. In a hybrid ring mixer having on an insulating substrate a conducting loop and conductors spaced along the loop extending outward therefrom comprising ports, the improvement comprising,
   at least one conducting portion extending radially inward of said conducting loop defining a mixer diode port,
   a central conductor on said substrate inside said loop,
   and a semiconductor device connected between said central conductor and said conducting portions extending inward,
   wherein said conducting loop and conductors are mounted upon a front side of said insulating substrate formed with a via opening and having its back side conductively coated including the region around said via opening to establish conductive contact between the conductor on said back side and said central conductor.

2. The improvement in accordance with claim 1 and further comprising, a second of said conducting portions extending inward,
   and a second semiconductor device connected between said second conducting portion and said central conductor.

3. The improvement in accordance with claim 2 wherein said loop comprises an annular conducting ring on said insulating substrate separated thereby from a conducting surface comprising a ground plane,
   first and second of the outwardly extending conductors extending radially outward from said annular ring angularly spaced about the center of said ring by substantially 120°,
   said first and second conducting portions extending radially inward angularly spaced from each other about said ring by substantially 120° and angularly spaced about said ring from at least one of said conductors extending radially outward by substantially 60°.

4. In a hybrid ring mixer having on an insulating substrate a conducting loop and conductors spaced along the loop extending outward therefrom comprising ports, the improvement comprising,
   at least one conducting portion extending radially inward of said conducting loop defining a mixer diode port,
   a central conductor on said substrate inside said loop,
   a semiconductor device connected between said central conductor and said conducting portions extending inward,
   a second of said conducting portions extending inward,
   a second semiconductor device connected between said second conducting portion and said central conductor,
   wherein said loop comprises an annular conducting ring on said insulating substrate separated thereby from a conducting surface comprising a ground plane,
   first and second of the outwardly extending conductors extending radially outward from said annular ring angularly spaced about the center of said ring by substantially 120°,
   said first and second conducting portions extending radially inward angularly spaced from each other about said ring by substantially 120° and angularly spaced about said ring from at least one of said conductors extending radially outward by substantially 60°,
   a third conductor extending radially outward from said annular ring and spaced from said first and said second conductors extending radially outward by substantially 120°,
   said central conductor comprising first and second circular sector portions of different radius bounded by radii extending from the center of said annular ring, respective ones of said radii bisecting the first and third of said conductors extending radially outward.

5. A method of making an improved hybrid ring mixer having on an insulating substrate a conducting loop and conductors spaced along the loop extending outward therefrom comprising ports, at least one conducting portion extending radially inward of said conducting loop defining a mixer diode port, a central conductor on said substrate inside said loop, and a semiconductor device connected between said central conductor and said conducting portion extending inward, wherein said conducting loop and conductors are mounted upon a front side of a said insulating substrate formed with a via opening and having its back side conductively coated including the region around said via opening to establish conductive contact between the conductor on said back side and said central conductor, which method includes the steps of,
   forming first and second epitaxial layers of different conductivity in said substrate,
   etching through said first epitaxial layer to said second epitaxial layer and depositing conducting material on said second epitaxial layer,
   forming a contact on said first epitaxial layer,
   forming said conducting loop and said conductors on said front surface,
   etching through the back side of said substrate to form said via opening,
   and plating the back side and surface surrounding said via opening with conducting material to establish conductive contact between said central conductor and said back side conducting layer through said via opening.

* * * * *